United States Patent
Lee

(10) Patent No.: US 12,176,897 B2
(45) Date of Patent: Dec. 24, 2024

(54) INPUT BUFFER CIRCUIT IN SEMICONDUCTOR MEMORY DEVICE HAVING HYSTERESIS FUNCTION

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 181 days.

(21) Appl. No.: 17/957,384

(22) Filed: Sep. 30, 2022

(65) Prior Publication Data
US 2023/0253966 A1 Aug. 10, 2023

(30) Foreign Application Priority Data
Feb. 8, 2022 (KR) .................. 10-2022-0015867

(51) Int. Cl.
G11C 7/22 (2006.01)
G11C 7/10 (2006.01)
H03K 5/13 (2014.01)
H03K 19/0185 (2006.01)

(52) U.S. Cl.
CPC ... H03K 19/018507 (2013.01); G11C 7/1084 (2013.01); G11C 7/22 (2013.01); H03K 5/13 (2013.01)

(58) Field of Classification Search
CPC ............. H03K 19/018507; H03K 5/13; G11C 7/1084; G11C 7/22
USPC ..................................................... 365/189.05
See application file for complete search history.

Primary Examiner — Huan Hoang
Assistant Examiner — Daniel J King
(74) Attorney, Agent, or Firm — KILE PARK REED & HOUTTEMAN PLLC

(57) ABSTRACT

An input buffer circuit includes a reception sensing part that receives an input signal pair to generate an intermediate signal pair, a comparison buffering part that buffers the intermediate signal pair to generate a buffered signal pair, an intrinsic buffered signal of the buffered signal pair being controlled to a first logic state as a level of the intrinsic intermediate signal is higher than a level of the complementary intermediate signal, a complementary buffered signal of the buffered signal pair is controlled to a second logic state as a level of the intrinsic intermediate signal is higher than a level of the complementary intermediate signal, and a hysteresis control part that drives the buffered signal pair to have forward hysteresis by using at least one of the intrinsic buffered signal and the complementary buffered signal.

20 Claims, 9 Drawing Sheets

INPUT BUFFER CIRCUIT IN SEMICONDUCTOR MEMORY DEVICE HAVING HYSTERESIS FUNCTION

CROSS-REFERENCE TO RELATED APPLICATION

This application claims priority to and the benefit of Korean Patent Application No. 10-2022-0015867 under 35 U.S.C. § 119, filed on Feb. 8, 2022, in the Korean Intellectual Property Office (KIPO), the entire contents of which are incorporated herein by reference.

BACKGROUND

1. Technical Field

The disclosure relates to an electronic circuit, and more particularly, to an input buffer circuit.

2. Discussion of Related Art

The input buffer circuit can work as an interface circuit for receiving an input signal pair from an external system, in a semiconductor memory device, etc. The input buffer circuit may be driven to adjust the voltage level of the input signal pair suitable for the internal voltage level. The input signal pair generally consists of an intrinsic input signal and a complementary input signal.

This input buffer circuit makes a comparison in the voltage levels between the intrinsic input signal and the complementary input signal, and generates a buffered signal pair. The buffered signal pair generally consists of an intrinsic buffered signal and a complementary buffered signal. Each of the intrinsic buffered signal and the complementary buffered signal is controlled to have logic state according to the result of the comparison in the voltage levels between the intrinsic input signal and the complementary input signal.

However, the input signal pair can be in high impedance state. In this case, the voltage level of the intrinsic input signal is substantially equal or close to that of the complementary input signal.

In this case, although the voltage level difference between the intrinsic input signal and the complementary input signal may be small or insignificant, the logic state of the buffered signal pair may be changed frequently.

As a result, a malfunction may occur in the semiconductor memory device.

SUMMARY

The disclosure is directed to an input buffer circuit capable of preventing malfunction of a semiconductor memory device, with respect to the input signal pair in high impedance state.

According to an aspect of the disclosure, there is provided an input buffer circuit for buffering an input signal pair received from an external system to generate a buffered signal pair, wherein the input signal pair comprises an intrinsic input signal and a complementary input signal and the buffered signal pair comprises an intrinsic buffered signal and a complementary buffered signal.

The input buffer circuit according to the disclosure may include a reception sensing part that receives an input signal pair to generate an intermediate signal pair, a level relation between an intrinsic intermediate signal of the intermediate signal pair and a complementary intermediate signal of the intermediate signal pair being associated with a level relation between an intrinsic input signal of the input signal pair and a complementary input signal of the input signal pair; a comparison buffering part that buffers the intermediate signal pair to generate a buffered signal pair, an intrinsic buffered signal of the buffered signal pair being controlled to a first logic state as a level of the intrinsic intermediate signal is higher than a level of the complementary intermediate signal, a complementary buffered signal of the buffered signal pair being controlled to a second logic state as the level of the intrinsic intermediate signal is higher than the level of the complementary intermediate signal, the second logic state being opposite to the first logic state; and a hysteresis control part that drives the buffered signal pair to have forward hysteresis by using at least one of the intrinsic buffered signal and the complementary buffered signal.

The reception sensing part may include a reception common node; a reception biasing part disposed between a node of a first power voltage and the reception common node, and controlling a voltage level of the reception common node toward the first power voltage; an input receiving part comprising an intrinsic receiving transistor disposed between the reception common node and a node of the intrinsic intermediate signal; and a complementary receiving transistor disposed between the reception common node and a node of the complementary intermediate signal; and a sourcing part electrically connected to a second power voltage and sourcing current of the intrinsic intermediate signal and the complementary intermediate signal.

The comparison buffering part may a first comparison buffering part that compares the levels of the intrinsic intermediate signal and the complementary intermediate signal and buffers the intrinsic intermediate signal and the complementary intermediate signal to generate the intrinsic buffered signal; and a second comparison buffering part that compares the levels of the intrinsic intermediate signal and the complementary intermediate signal and buffers the intrinsic intermediate signal and the complementary intermediate signal to generate the complementary buffered signal.

The hysteresis control part may be driven to control the intrinsic buffered signal and the complementary buffered signal to have forward hysteresis.

The hysteresis control part may include a delay part that delays the intrinsic buffered signal to generate a delay signal; an intrinsic hysteresis transistor disposed between a node of a first power voltage and the intrinsic intermediate signal, the intrinsic hysteresis transistor being turned-on in response to the first logic state of the delay signal; and a complementary hysteresis transistor disposed between the node of the first power voltage and the complementary intermediate signal, the complementary hysteresis transistor being turned-on in response to the second logic state of the delay signal.

The first power voltage may be a power supply voltage, and each of the intrinsic hysteresis transistor and the complementary hysteresis transistor may be a PMOS type transistor.

The hysteresis control part may control the buffered signal pair to have forward hysteresis according to deactivation of a write signal, and control the buffered signal pair to have backward hysteresis according to activation of the write signal.

The hysteresis control part may include a selection delay part that delays the intrinsic buffered signal to generate a selection delay signal, the selection delay signal being a signal delayed with respect to the intrinsic buffered signal according to deactivation of the write signal, the selection delay signal being a signal delayed and inverted with respect to the intrinsic buffered signal according to activation of the write signal; an intrinsic hysteresis transistor disposed between a node of a first power voltage and the intrinsic intermediate signal, the intrinsic hysteresis transistor being turned-on in response to the first logic state of the selection delay signal; and a complementary hysteresis transistor disposed between the node of the first power voltage and the complementary intermediate signal, the complementary hysteresis transistor being turned-on in response to the second logic state of the selection delay signal.

The selection delay part may include a polarity selection part that receives the intrinsic buffered signal to generate a delay preliminary signal, the delay preliminary signal being a signal in a same phase with respect to the intrinsic buffered signal according to deactivation of the write signal, the delay preliminary signal being a signal in an opposite phase with respect to the intrinsic buffered signal according to activation of the write signal; and a delay part that delays the delay preliminary signal to generate the selection delay signal.

The first power voltage may be a power supply voltage, and each of the intrinsic hysteresis transistor and the complementary hysteresis transistor may be a PMOS type transistor.

The hysteresis control part may control the buffered signal pair to have forward hysteresis according to deactivation of a write signal, and control the buffered signal pair to have backward hysteresis according to activation of the write signal, and the backward hysteresis of the buffered signal pair may be prevented according to a blocking signal.

The hysteresis control part may include a selection delay part that delays the intrinsic buffered signal to generate a selection delay signal, the selection delay signal being a signal delayed with respect to the intrinsic buffered signal according to deactivation of the write signal, the selection delay signal being a signal delayed and converted with respect to the intrinsic buffered signal according to activation of the write signal; an intrinsic hysteresis transistor disposed between a node of a first power voltage and the intrinsic intermediate signal, the intrinsic hysteresis transistor being turned-on in response to the first logic state of the selection delay signal, a turn-on of the intrinsic hysteresis transistor being prevented according to activation of both of the write signal and the blocking signal; and a complementary hysteresis transistor disposed between the node of the first power voltage and the complementary intermediate signal, the complementary hysteresis transistor being turned-on in response to the second logic state of the selection delay signal, a turn-on of the complementary hysteresis transistor being prevented according to activation of both of the write signal and the blocking signal.

The selection delay part may include a polarity selection part that receives the intrinsic buffered signal to generate a delay preliminary signal, the delay preliminary signal being a signal in a same phase with respect to the intrinsic buffered signal according to deactivation of the write signal, the delay preliminary signal being a signal in an opposite phase with respect to the intrinsic buffered signal according to activation of the write signal; and a delay part that delays the delay preliminary signal to generate the selection delay signal.

The first power voltage may be a power supply voltage, and each of the intrinsic hysteresis transistor and the complementary hysteresis transistor may be a PMOS type transistor.

A memory device may comprise an input buffer circuit including a reception sensing part that receives an input signal pair to generate an intermediate signal pair, a level relation between an intrinsic intermediate signal of the intermediate signal pair and a complementary intermediate signal of the intermediate signal pair being a function of a level relation between an intrinsic input signal of the input signal pair and a complementary input signal of the input signal pair; a comparison buffering part that buffers the intermediate signal pair to generate a buffered signal pair, an intrinsic buffered signal of the buffered signal pair being controlled to a first logic state as a level of the intrinsic intermediate signal is higher than a level of the complementary intermediate signal, a complementary buffered signal of the buffered signal pair is controlled to a second logic state as a level of the intrinsic intermediate signal is higher than a level of the complementary intermediate signal, the second logic state being opposite to the first logic state; and a hysteresis control part that drives the buffered signal pair to have forward hysteresis by using at least one of the intrinsic buffered signal and the complementary buffered signal.

The reception sensing part may include a reception common node; a reception biasing part formed between a node of a first power voltage and the reception common node, and controlling a voltage level of the reception common node toward the first power voltage; an input receiving part comprising an intrinsic receiving transistor disposed between the reception common node and a node of the intrinsic intermediate signal; and a complementary receiving transistor disposed between the reception common node and a node of the complementary intermediate signal; and a sourcing part electrically connected to a second power voltage and sourcing current of the intrinsic intermediate signal and the complementary intermediate signal.

The comparison buffering part may include a first comparison buffering part that compares the levels of the intrinsic intermediate signal and the complementary intermediate signal and buffers the intrinsic intermediate signal and the complementary intermediate signal to generate the intrinsic buffered signal; and a second comparison buffering part that compares the levels of the intrinsic intermediate signal and the complementary intermediate signal and buffers the intrinsic intermediate signal and the complementary intermediate signal to generate the complementary buffered signal.

The hysteresis control part may be driven to control the intrinsic buffered signal and the complementary buffered signal to have forward hysteresis.

The hysteresis control part may include a delay part that delays the intrinsic buffered signal to generate a delay signal; an intrinsic hysteresis transistor disposed between a node of a first power voltage and the intrinsic intermediate signal, the intrinsic hysteresis transistor being turned-on in response to the first logic state of the delay signal; and a complementary hysteresis transistor disposed between the node of the first power voltage and the complementary intermediate signal, the complementary hysteresis transistor being turned-on in response to the second logic state of the delay signal.

The first power voltage may be a power supply voltage, and each of the intrinsic hysteresis transistor and the complementary hysteresis transistor may be a PMOS type transistor.

BRIEF DESCRIPTION OF THE DRAWINGS

The above and other objects, features and advantages of the disclosure will become more apparent to those skilled in the art by describing in detail exemplary embodiments thereof with reference to the accompanying drawings, in which.

DETAILED DESCRIPTION OF THE EMBODIMENTS

Figure 1:
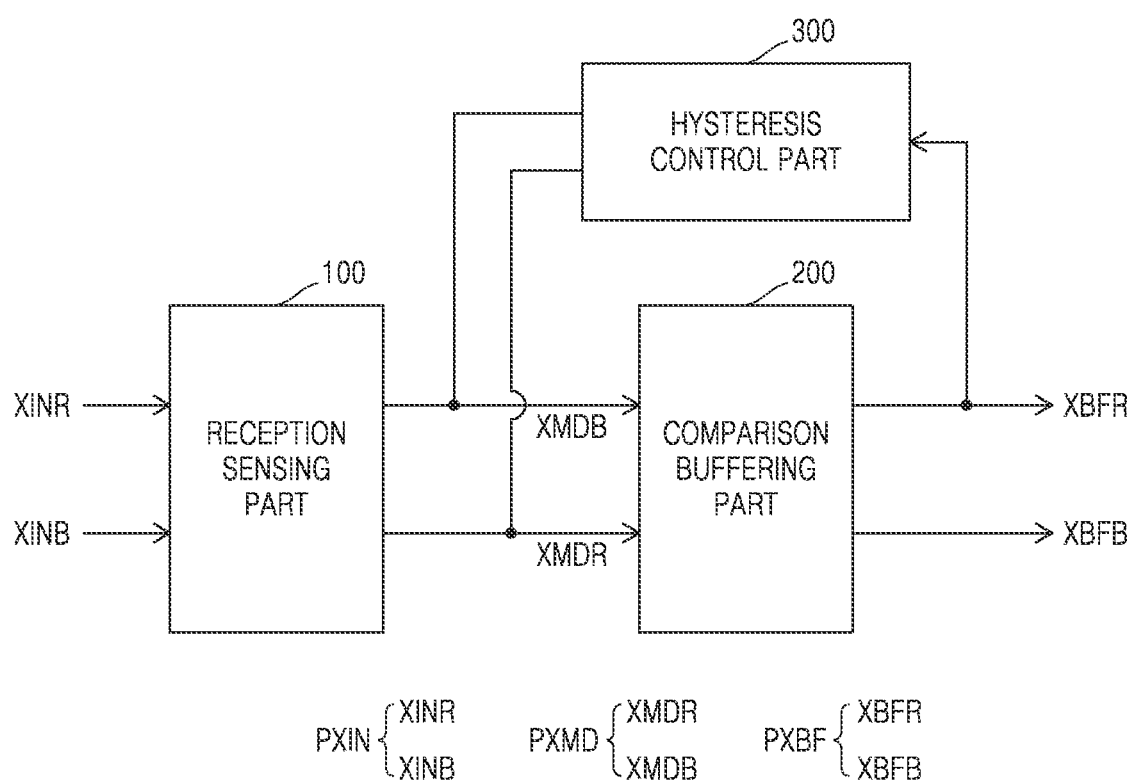
FIG. 1 is a diagram schematically illustrating an example of an input buffer circuit according to an embodiment of the disclosure.

Example embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular form such as "a" or "an" is intended to include the plural form as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

In the disclosure, the term of "hysteresis" refers to a phenomenon that the state of a certain signal is determined not only by the conditions placed on it but also by the phase in which the signal has passed in the past. The term of "forward hysteresis" means a hysteresis in which the state transition of the signal is occurred later than in the absence of hysteresis. The term of "backward hysteresis" means a hysteresis in which the state transition of the signal is occurred earlier than in the absence of hysteresis.

Hereinafter, embodiments of the disclosure will be described in detail with reference to the accompanying drawings.

FIG. 1 is a diagram illustrating an input buffer circuit according to an embodiment of the disclosure. The input buffer circuit of the disclosure may buffer an input signal pair PXIN received from an external system to generate a buffered signal pair PXBF. Here, the input signal pair PXIN may include (or consist of) an intrinsic input signal XINR and a complementary input signal XINB. For example, the input signal pair PXIN may be equivalent to a clock signal, a data strobe signal, or the like.

The phase of the intrinsic input signal XINR may be opposite to that of the complementary input signal XINB in a stable state.

However, in cases such as receiving inputs from the external system, the intrinsic input signal XINR and the complementary input signal XINB may have a substantially same voltage as each other (or voltages with a small difference). For example, in case that a low voltage terminating resistor (not shown) is installed in the external system, the voltage levels of the intrinsic input signal XINR and the complementary input signal XINB may all be at a level close to (or substantially equal to) the ground voltage VSS.

The buffered signal pair PXBF may include (or consist of) an intrinsic buffered signal XBFR and a complementary buffered signal XBFB.

Referring to FIG. 1, the input buffer circuit according to the disclosure may include a reception sensing part 100, a comparison buffering part 200, and a hysteresis control part 300.

The reception sensing part 100 may receive the input signal pair PXIN, and generate an intermediate signal pair PXMD. The intermediate signal pair PXMD may include (or consist of) an intrinsic intermediate signal XMDR and a complementary intermediate signal XMDB having a phase opposite to each other.

Figure 2:
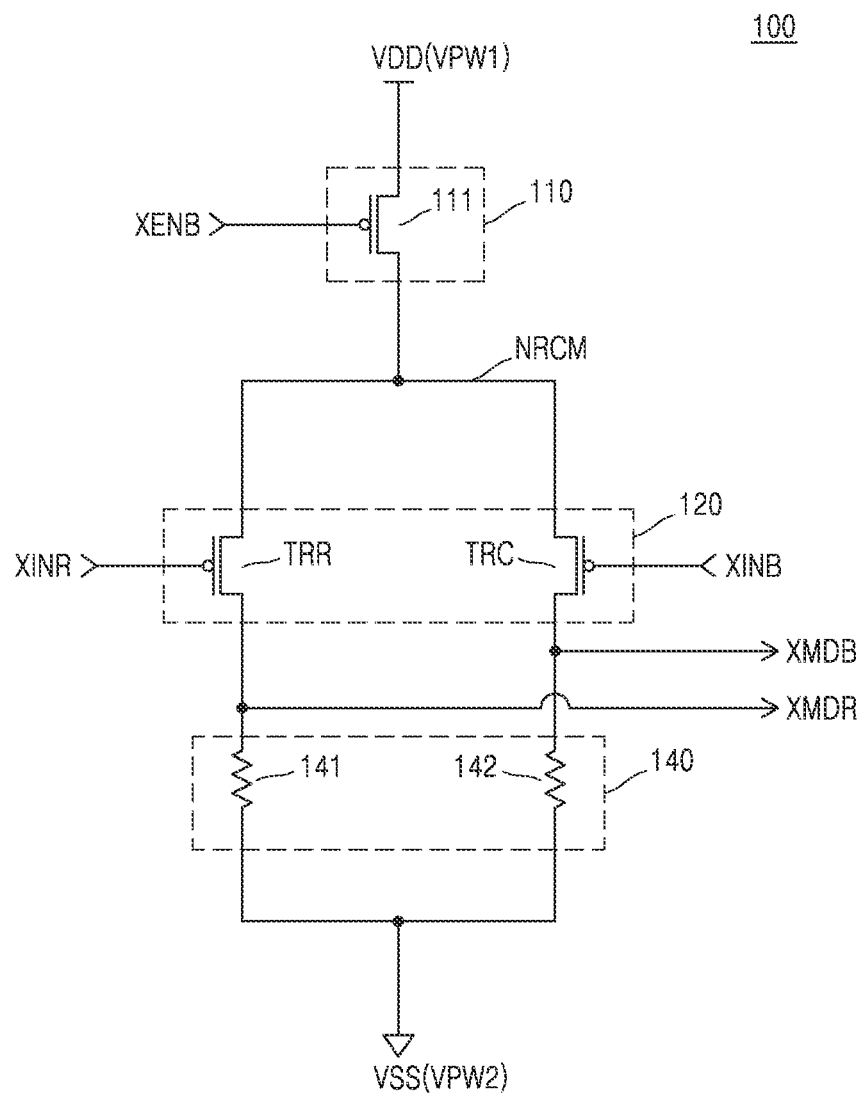
FIG. 2 is a schematic diagram of an equivalent circuit of an example of a reception sensing part of FIG. 1.

FIG. 2 is a schema diagram of an equivalent circuit of the reception sensing part 100 of FIG. 1. Referring to FIG. 2, the reception sensing part 100 may include a reception common node NRCM, a reception biasing unit (or reception biasing part) 110, an input receiving unit (or input receiving part) 120, and a sourcing unit (or sourcing part) 140.

The reception biasing unit 110 may be formed between a first power voltage VPW1 and the reception common node NRCM. In this embodiment, the first power voltage VPW1 may be a power supply voltage VDD.

The reception biasing unit 110 may include a biasing transistor 111, which may be formed between the power supply voltage VDD and the reception common node NRCM.

The biasing transistor 111 may be a PMOS type transistor responding to an enable signal XENB. In case that the biasing transistor 111 is turned on, a current may flow between the power supply voltage VDD and the reception common node NRCM.

For example, in case that the enable signal XENB is activated to "L", the power supply voltage VDD may be applied to the reception common node NRCM.

The input receiving unit 120 may comprise an intrinsic receiving transistor TRR and a complementary receiving transistor TRC.

The intrinsic receiving transistor TRR may be formed (or disposed) between the reception common node NRCM and a node of the intrinsic intermediate signal XMDR. The intrinsic receiving transistor TRR may be a PMOS type transistor, a gate of which is connected to the intrinsic input signal XINR.

The complementary receiving transistor TRC may be formed between the reception common node NRCM and a node of the complementary intermediate signal XMDB. The complementary receiving transistor TRB may be a PMOS type transistor, a gate of which is connected to the complementary input signal XINB.

The sourcing unit 140 may be connected to a second power voltage VPW2. In this embodiment, the second power voltage VPW2 may be a ground voltage VSS. By the sourcing unit 140, the current of the intrinsic intermediate signal XMDR and the current of the complementary intermediate signal XMDB may be sourced.

The sourcing unit 140 may include an intrinsic resistor 141 and a complementary resistor 142. The intrinsic resistor 141 is formed between the node of the intrinsic intermediate signal XMDR and a node of the second power voltage VPW2. The complementary resistor 142 may be formed between the node of the complementary intermediate signal XMDB and the node of the second power voltage VPW2.

According to the reception sensing part 100, the level relation between the intrinsic intermediate signal XMDR and the complementary intermediate signal XMDB may be associated with (or depend on) the level relation between the intrinsic input signal XINR and the complementary input signal XINB, e.g., the opposite of the level relation between the intrinsic input signal XINR and the complementary input signal XINB.

For example, in this embodiment, in case that the voltage of the intrinsic input signal XINR is higher than that of the complementary input signal XINB, the voltage level of the intrinsic intermediate signal XMDR may be lower than that of the complementary intermediate signal XMDB.

In case that the voltage of the intrinsic input signal XINR is lower than that of the complementary input signal XINB, the voltage level of the intrinsic intermediate signal XMDR may be higher than that of the complementary intermediate signal XMDB.

Referring again to FIG. 1, the comparison buffering part 200 may generate the buffered signal pair PXBF by buffering the intermediate signal pair PXMD.

Figure 3:
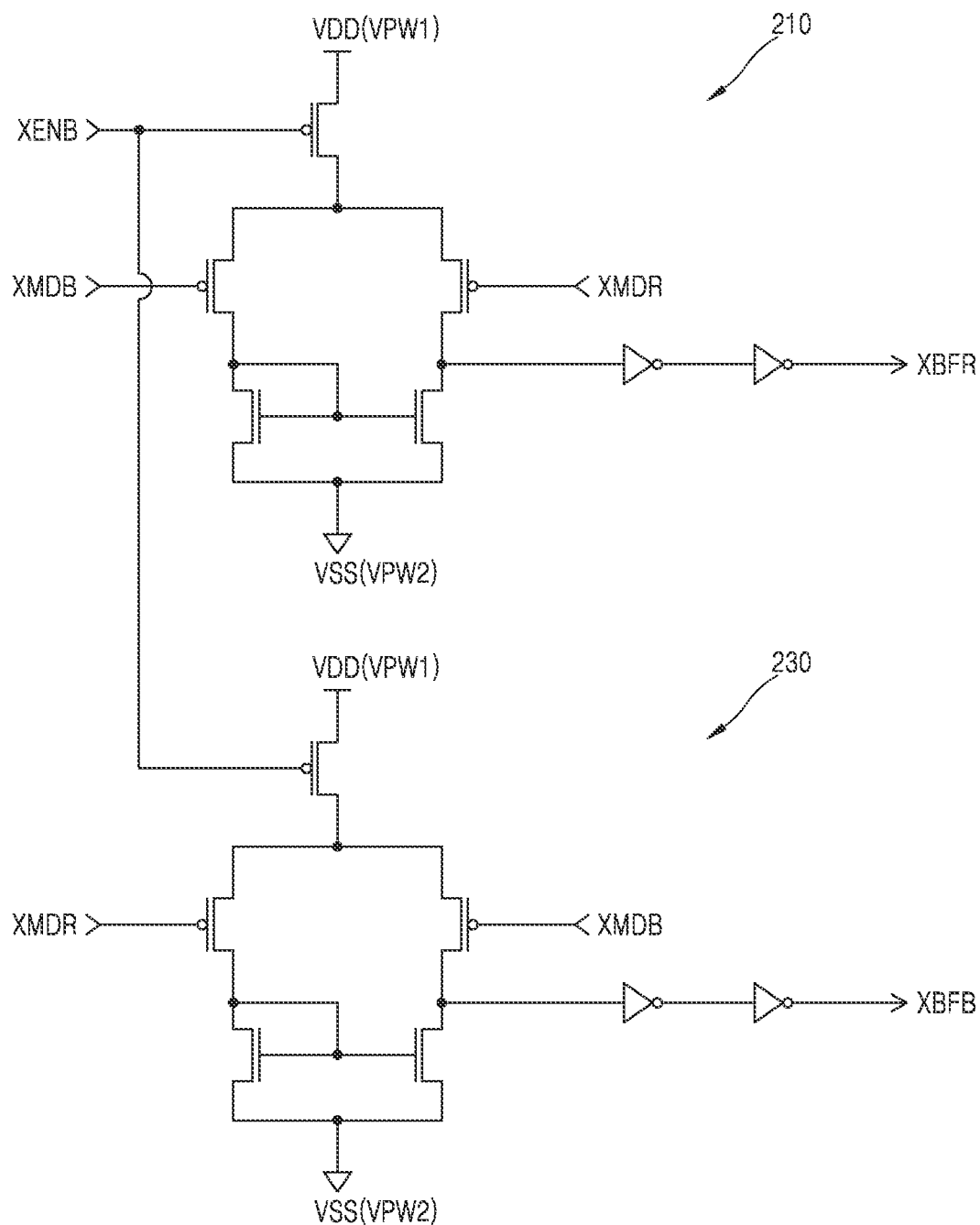
FIG. 3 is a schematic diagram of an equivalent circuit of an example of a comparison buffering part of FIG. 1.

FIG. 3 is a schematic diagram of an equivalent circuit of a comparison buffering part 200 of FIG. 1. Referring to FIG. 3, the comparison buffering part 200 may include a first comparison buffering unit 210 and a second comparison buffering unit 230.

The first comparison buffering unit 210 may be enabled in response to the activation of "L" of the enable signal XENB. The first comparison buffering unit 210 may generate the intrinsic buffered signal XBFR by comparing and buffering the levels of the intrinsic intermediate signal XMDR and the complementary intermediate signal XMDB.

The intrinsic buffered signal XBFR may be controlled to be in the first logic state, as the voltage level of the intrinsic intermediate signal XMDR is higher than the voltage level of the complementary intermediate signal XMDB. In this embodiment, the first logic state is "L".

For example, in this embodiment, the intrinsic buffered signal XBFR may be controlled to "L", as the voltage level of the intrinsic input signal XINR is lower than the voltage level of the complementary input signal XINB.

The second comparison buffering unit 230 may be enabled in response to the activation of "L" of the enable signal XENB. The second comparison buffering unit 230 may generate the complementary buffered signal XBFB by comparing and buffering the levels of the intrinsic intermediate signal XMDR and the complementary intermediate signal XMDB.

The complementary buffered signal XBFB is controlled to be in the second logic state, as the voltage level of the intrinsic intermediate signal XMDR is higher than the voltage level of the complementary intermediate signal XMDB. In this embodiment, the second logic state is "H", which is contrary to the first logic state.

For example, in this embodiment, the complementary buffered signal XBFB is controlled to "H", as the voltage level of the intrinsic input signal XINR is lower than the voltage level of the complementary input signal XINB.

Referring again to FIG. 1, the hysteresis control part 300 may drive the buffered signal pair PXBF to have forward hysteresis by using at least one of the intrinsic buffered signal XBFR and the complementary buffered signal XBFB.

The hysteresis control part 300 may be in various forms.

Figure 4:
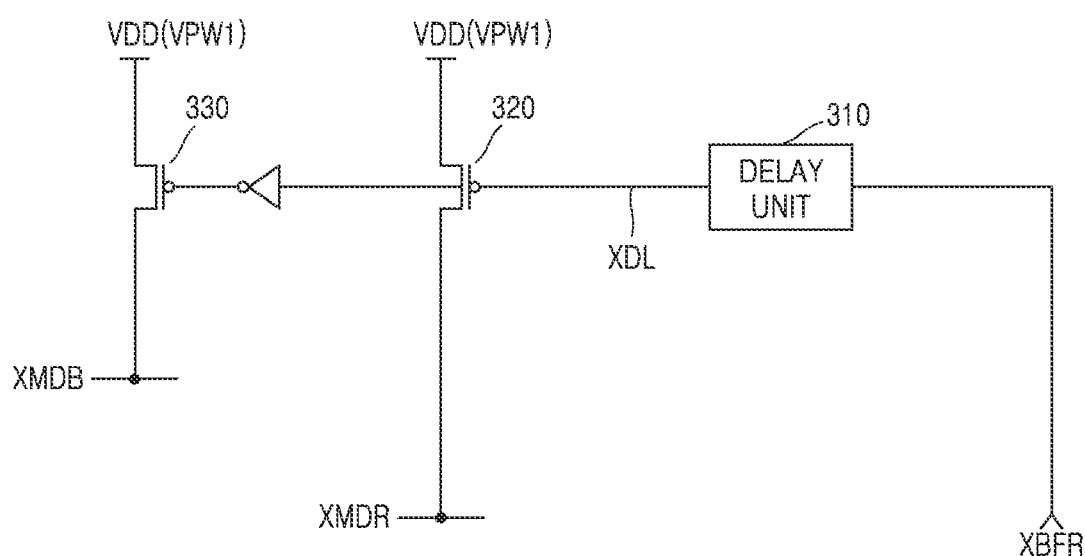
FIG. 4 is a schematic diagram of an equivalent circuit of an example of a hysteresis control part of FIG. 1.

FIG. 4 is a schematic diagram of an equivalent circuit of an example of the hysteresis control part 400 of FIG. 1. Referring to FIG. 4, the hysteresis control part 400 may include a delay unit 310, an intrinsic hysteresis transistor 320 and a complementary hysteresis transistor 330.

The delay unit 310 may generate a delay signal XDL by delaying the intrinsic buffered signal XBF.

The intrinsic hysteresis transistor 320 may be a PMOS type transistor between the first power voltage and the intrinsic intermediate signal XMDR. The intrinsic hysteresis transistor 320 may be turned-on in response to "L" state of the delay signal XDR. The first power voltage may be the power supply voltage VDD.

For example, in case that the voltage level of the intrinsic intermediate signal XMDR is higher than the voltage level of the complementary intermediate signal XMDB, the intrinsic hysteresis transistor 320 may be turned on. Accordingly, the voltage level of the intrinsic intermediate signal XMDR may be further increased.

The complementary hysteresis transistor 330 may be a PMOS type transistor between the power supply voltage VDD and the complementary intermediate signal XMDB. The complementary hysteresis transistor 330 may be turned-on in response to "H" state of the delay signal XDR.

Accordingly, the absolute value of the voltage level difference between the intrinsic intermediate signal XMDR and the complementary intermediate signal XMDB may be further increased.

For example, the required absolute value of the voltage level difference between the intrinsic input signal XINR and the complementary input signal XINB may be further increased to change the logic state of the intrinsic buffered signal XBFR and the complementary buffered signal XBFB.

Figure 5:
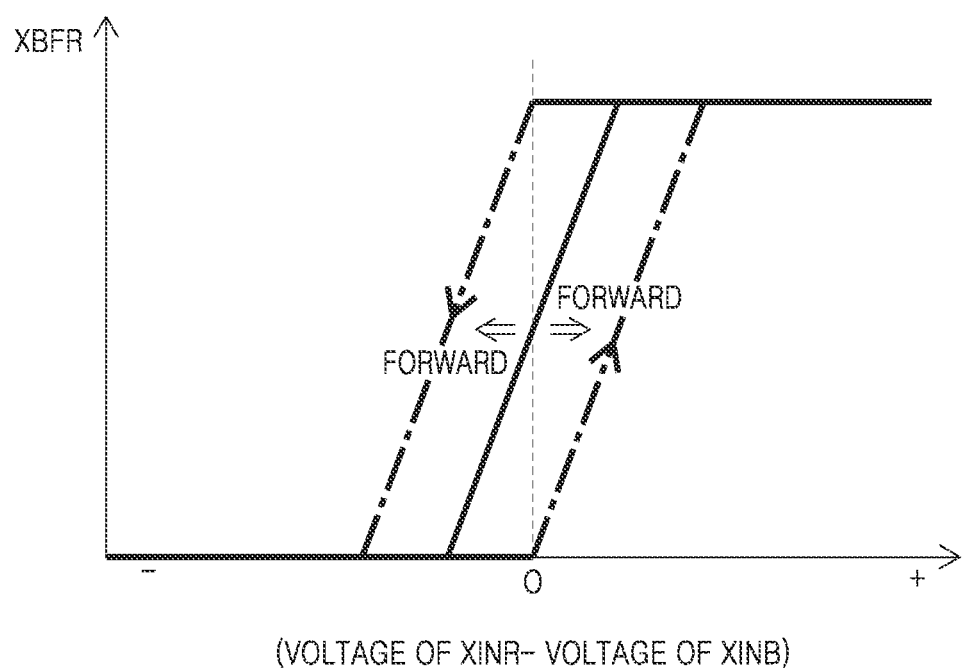
FIG. 5 is a graph illustrating the hysteresis in the buffered signal pair of FIG. 1 in case that the example of FIG. 4 is applied.

As a result, according to the hysteresis control part 300, both of the intrinsic buffered signal XBFR and the complementary buffered signal XBFB may have the forward hysteresis. For example, in both of rising and falling transitions, the transition time of the intrinsic buffered signal XBFR and the complementary buffered signal XBFB may be later than in absence of hysteresis, as shown in FIG. 5.

Figure 6:
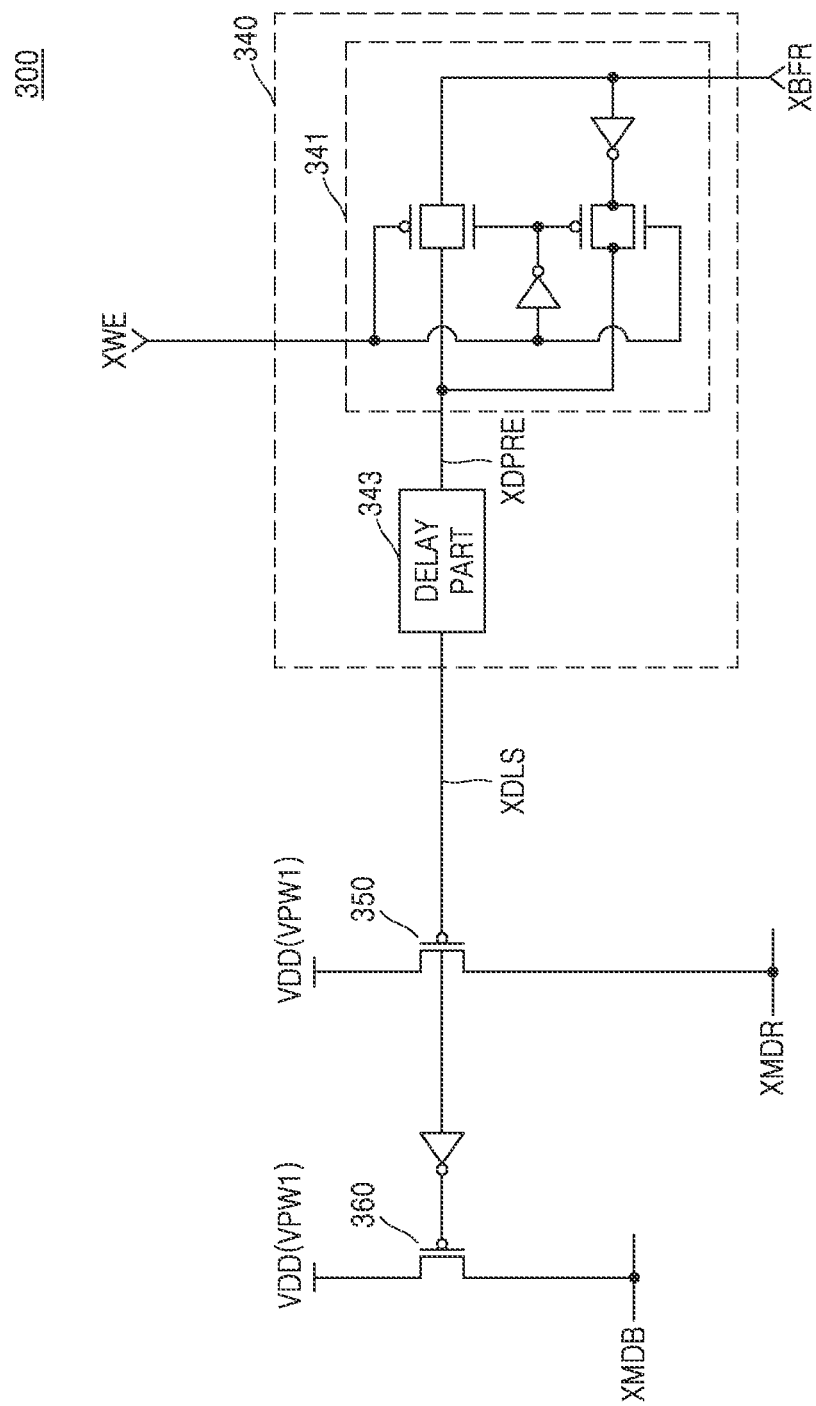
FIG. 6 is a schematic diagram of an equivalent circuit of another example of a hysteresis control part of FIG. 1.

FIG. 6 is a schematic diagram of an equivalent circuit of another example of the hysteresis control part 300 of FIG. 1. The hysteresis control part 300 of FIG. 6 may include a selection delay unit 340, an intrinsic hysteresis transistor 350, and a complementary hysteresis transistor 360.

The selection delay unit 340 may generate a selection delay signal XDLS by delaying the intrinsic buffered signal XBFR in selective polarity. For example, in case that a write signal XWE is deactivated to "L", the selection delay signal XDLS may be generated by delaying the intrinsic buffered signal XBFR. In case that the write signal XWE is activated to "H", the selection delay signal XDLS may be generated by delaying and inverting the intrinsic buffered signal XBFR.

The selection delay unit 340 may comprise a polarity selection part (or polarity selection circuit) 341 and a delay part (or delay circuit) 343.

The polarity selection part 341 may receive the write signal XWE and the intrinsic buffered signal XBFR and may generate a delay preliminary signal XDPRE.

Here, the write signal XWE may be a signal activated in the elapse of some latency after the command is generated.

The delay preliminary signal XDPRE may be a signal that is in the same phase with respect to the intrinsic buffered signal XBFR according to the deactivation of "L" of the write signal XWE. The delay preliminary signal XDPRE may be a signal that is in the opposite phase with respect to the intrinsic buffered signal XBFR according to the activation of "H" of the write signal XWE.

The delay part 343 may delay the delay preliminary signal XDPRE to generate the selection delay signal XDLS.

The intrinsic hysteresis transistor 350 may be a PMOS type transistor formed between the power supply voltage VDD and the intrinsic intermediate signal XMDR. The intrinsic hysteresis transistor 350 may be turned-on in response to "L" of the selection delay signal XDLS.

The complementary hysteresis transistor 360 may be a PMOS type transistor formed between the power supply voltage VDD and the complementary intermediate signal XMDB. The complementary hysteresis transistor 360 may be turned-on in response to "H" of the selection delay signal XDLS.

The operations of the intrinsic hysteresis transistor 350 and the complementary hysteresis transistor 360 can be described as follows.

First, in the inactive state of "L" of the write signal XWE, in case that the voltage level of the intrinsic intermediate signal XMDR is higher than the voltage level of the complementary intermediate signal XMDB, the intrinsic hysteresis transistor 350 may be turned-on. Accordingly, the voltage level of the intrinsic intermediate signal XMDR may be increased.

In the inactive state of "L" of the write signal XWE, in case that the voltage level of the complementary intermediate signal XMDB is higher than the voltage level of the intrinsic intermediate signal XMDR, the complementary hysteresis transistor 360 may be turned-on. Accordingly, the voltage level of the complementary intermediate signal XMDB may be increased.

For example, in case that the write signal XWE is in the inactive state of "L", the absolute value of the voltage level difference between the intrinsic intermediate signal XMDR and the complementary intermediate signal XMDB may be increased. Accordingly, the required absolute value of the voltage level difference between the intrinsic input signal XINR and the complementary input signal XINB may be increased to change the logic state of the intrinsic buffered signal XBFR and the complementary buffered signal XBFB.

Figure 7A:
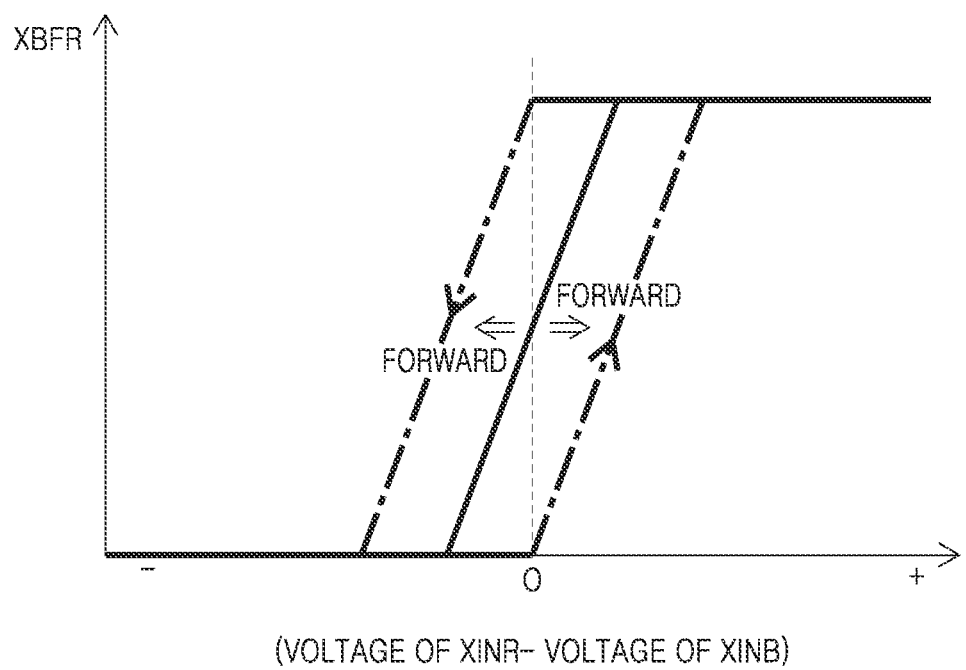
FIG. 7A and FIG. 7B are graphs illustrating the hysteresis in the buffered signal pair of FIG. 1 in case that the example of FIG. 6 is applied.

As a result, in case that the write signal XWE is in the inactive state of "L", both of the intrinsic buffered signal XBFR and the complementary buffered signal XBFB may have the forward hysteresis. For example, in both of rising and falling transitions, the transition time of the intrinsic buffered signal XBFR and the complementary buffered signal XBFB may occur later than in absence of hysteresis, as shown in FIG. 7A.

Next, in the active state of "H" of the write signal XWE, in case that the voltage level of the intrinsic intermediate signal XMDR is higher than the voltage level of the complementary intermediate signal XMDB, the complementary hysteresis transistor 360 may be turned-on. Accordingly, the voltage level of the complementary intermediate signal XMDB may be increased.

In the active state of "H" of the write signal XWE, in case that the voltage level of the complementary intermediate signal XMDB is higher than the voltage level of the intrinsic intermediate signal XMDR, the intrinsic hysteresis transistor 350 may be turned-on. Accordingly, the voltage level of the intrinsic intermediate signal XMDR may be increased.

For example, in case that the write signal XWE is in the active state of "H", the absolute value of the voltage level difference between the intrinsic intermediate signal XMDR and the complementary intermediate signal XMDB may be decreased. Accordingly, the required absolute value of the voltage level difference between the intrinsic input signal XINR and the complementary input signal XINB may be decreased to change the logic state of the intrinsic buffered signal XBFR and the complementary buffered signal XBFB.

Figure 7B:
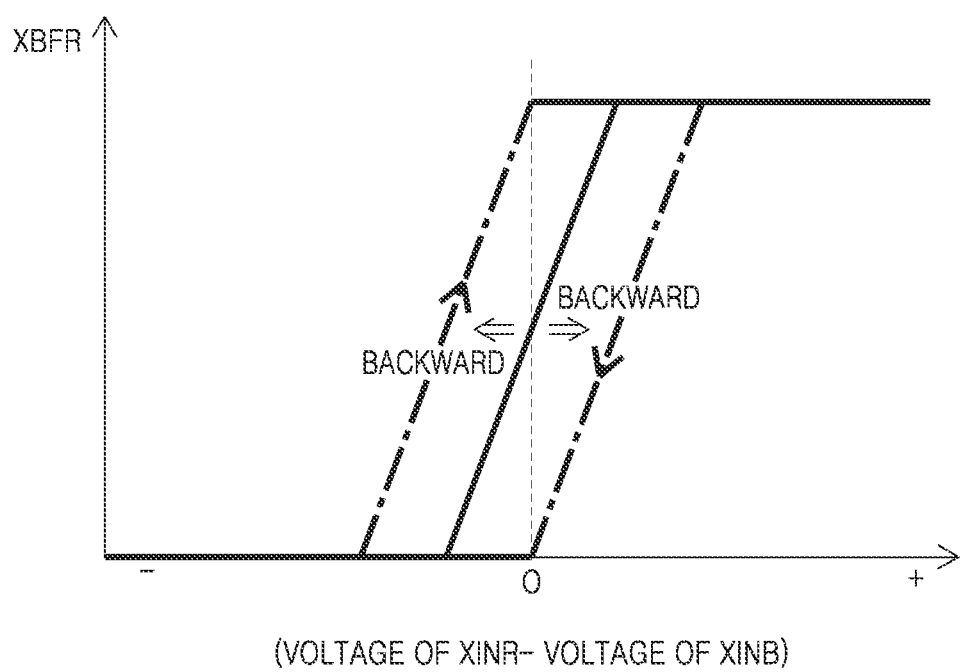

As a result, in case that the write signal XWE is in the active state of "H", both of the intrinsic buffered signal XBFR and the complementary buffered signal XBFB may have the backward hysteresis. For example, in both of rising and falling transitions, the transition time of the intrinsic buffered signal XBFR and the complementary buffered signal XBFB is occurred earlier than in absence of hysteresis, as shown in FIG. 7B.

In the input buffer circuit of the disclosure having the hysteresis control part 300 of FIG. 6 configured as described above, the buffered signal pair PXBF has the forward hysteresis in the state before the input signal pair PXIN is stabilized, that is, the state in which the write signal XWE is inactivated. Accordingly, the malfunction of the semiconductor memory device may be alleviated.

Then, the buffered signal pair PXBF may have the backward hysteresis in the state in which the input signal pair PXIN is stabilized, that is, the state in which the write signal XWE is activated. Accordingly, in the input buffer circuit of the disclosure, the input signal pair PXIN can be buffered with a fast response speed.

Figure 8:
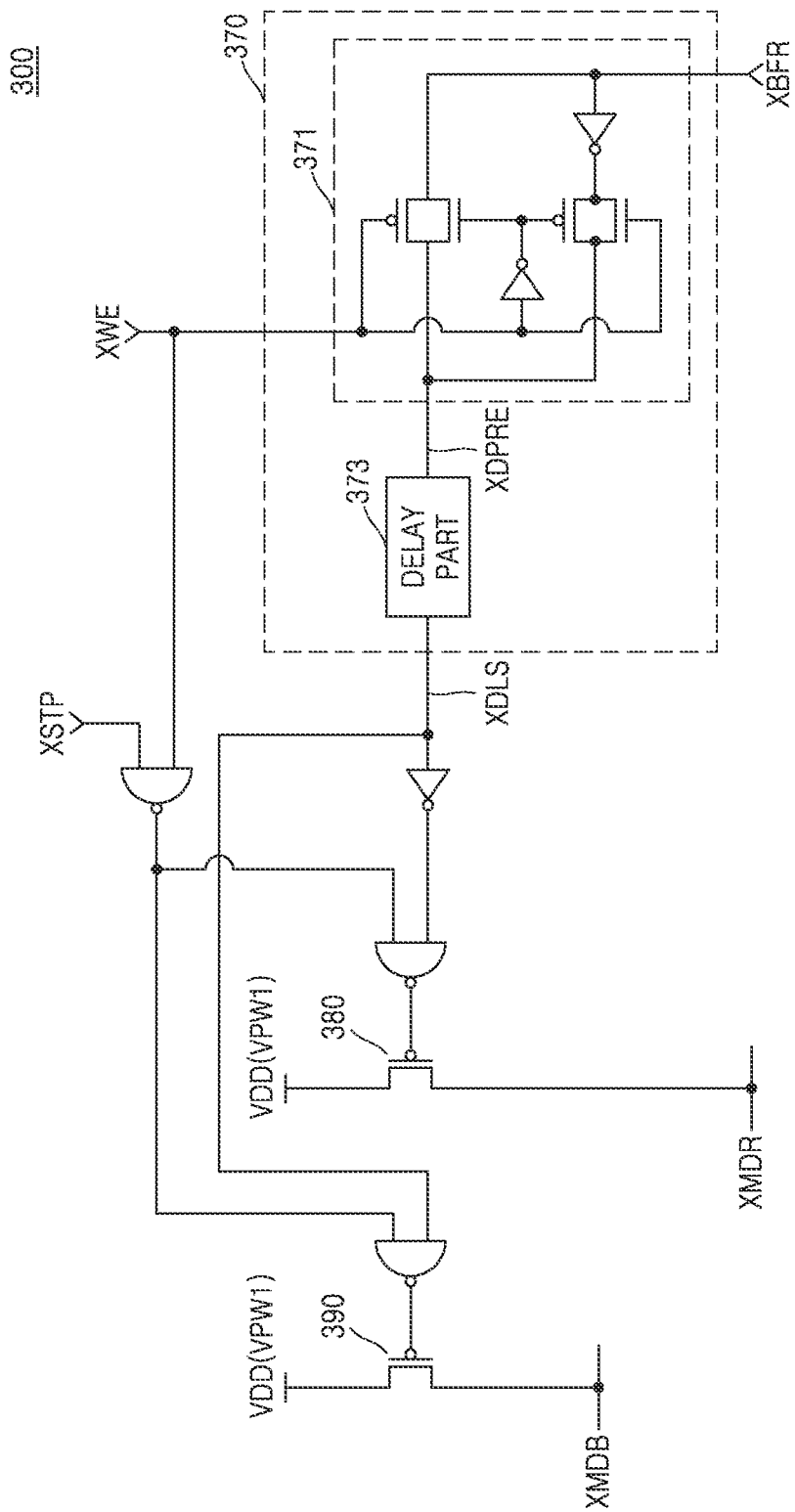
FIG. 8 is a schematic diagram of an equivalent circuit of another example of a hysteresis control part of FIG. 1.

FIG. 8 is a schematic diagram of an equivalent circuit of another example of a hysteresis control part of FIG. 1. The hysteresis control part 300 of FIG. 8 may include a selection delay unit 370, an intrinsic hysteresis transistor 380, and a complementary hysteresis transistor 390.

The selection delay unit 370 may generate a selection delay signal XDLS by delaying the intrinsic buffered signal XBFR in selective polarity. For example, in case that a write signal XWE is deactivated to "L", the selection delay signal XDLS may be generated by delaying the intrinsic buffered signal XBFR. In case that the write signal XWE is activated to "H", the selection delay signal XDLS may be generated by delaying and inverting the intrinsic buffered signal XBFR.

The selection delay unit 370 may comprise a polarity selection part 371 and a delay part 373.

The polarity selection part 371 may receive the write signal XWE and the intrinsic buffered signal XBFR, and generate a delay preliminary signal XDPRE.

The delay preliminary signal XDPRE may be a signal in the same phase with respect to the intrinsic buffered signal XBFR according to the deactivation of "L" of the write signal XWE. The delay preliminary signal XDPRE may be a signal in the opposite phase with respect to the intrinsic buffered signal XBFR according to the activation of "H" of the write signal XWE.

The delay part 373 may delay the delay preliminary signal XDPRE to generate the selection delay signal XDLS.

The intrinsic hysteresis transistor 380 may be a PMOS type transistor formed between the power supply voltage VDD and the intrinsic intermediate signal XMDR. The intrinsic hysteresis transistor 380 may be turned-on in response to "L" of the selection delay signal XDLS in case that at least one of the write signal XWE and a blocking signal XSTP is in the inactivated state of "L". However, the turn on of the intrinsic hysteresis transistor 380 may be prevented in case that both of the write signal XWE and a blocking signal XSTP are in the activated state of "H".

The complementary hysteresis transistor 390 may be a PMOS type transistor formed between the power supply voltage VDD and the complementary intermediate signal XMDB. The complementary hysteresis transistor 390 may be turned-on in response to "H" of the selection delay signal XDLS in case that at least one of the write signal XWE and a blocking signal XSTP is in the inactivated state of "L". However, the turn on of the complementary hysteresis transistor 390 may be prevented in case that both of the write signal XWE and a blocking signal XSTP are in the activated state of "H".

The operations of the intrinsic hysteresis transistor 380 and the complementary hysteresis transistor 390 can be described as follows.

First, it is assumed that the blocking signal XSTP is in an inactive state of "L". In this case, the operation of the intrinsic hysteresis transistor 380 and the complementary hysteresis transistor 390 of FIG. 8 may be substantially identical or similar to that of the intrinsic hysteresis transistor 350 and the complementary hysteresis transistor 360 of FIG. 6.

For example, in the inactive state of "L" of the write signal XWE, both of the intrinsic buffered signal XBFR and the complementary buffered signal XBFB may be forward hysteresis driven. In the active state of "H" of the write signal XWE, both of the intrinsic buffered signal XBFR and the complementary buffered signal XBFB may be backward hysteresis driven.

Next, it is assumed that the blocking signal XSTP is in an active state of "H".

In case that the write signal XWE is in the inactive state of "L", both of the intrinsic buffered signal XBFR and the complementary buffered signal XBFB may be forward hysteresis driven. However, even in case that the write signal XWE is in the active state of "H", the backward hysteresis driving of the intrinsic buffered signal XBFR and the complementary buffered signal XBFB may be prevented.

As a result, in the input buffer circuit of the disclosure having the hysteresis control part 300 of FIG. 8, the backward hysteresis driving of the intrinsic buffered signal XBFR and the complementary buffered signal XBFB may be determined based on the activation of the blocking signal XSTP.

The above description is an example of technical features of the disclosure, and those skilled in the art to which the disclosure pertains will be able to make various modifications and variations. Thus, the embodiments of the disclosure described above may be implemented separately or in combination with each other.

For example, in this disclosure, the embodiments in which the first supply voltage is the power supply voltage VDD and the second supply voltage is the ground voltage VSS have been illustrated and described. However, the technical idea of the disclosure may be implemented by an embodiment in which the first supply voltage is the ground voltage VSS and the second supply voltage is the power supply voltage VDD. In this case, the polarity of some transistors can be reversed compared to the embodiment.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. An input buffer circuit comprising:
   a reception sensing part that receives an input signal pair to generate an intermediate signal pair, a level relation between an intrinsic intermediate signal of the intermediate signal pair and a complementary intermediate signal of the intermediate signal pair being associated with a level relation between an intrinsic input signal of the input signal pair and a complementary input signal of the input signal pair;
   a comparison buffering part that buffers the intermediate signal pair to generate a buffered signal pair, an intrinsic buffered signal of the buffered signal pair being controlled to a first logic state as a level of the intrinsic intermediate signal is higher than a level of the complementary intermediate signal, a complementary buffered signal of the buffered signal pair being controlled to a second logic state as a level of the intrinsic intermediate signal is higher than a level of the complementary intermediate signal, the second logic state being opposite to the first logic state; and a hysteresis control part that drives the buffered signal pair to have forward hysteresis by using at least one of the intrinsic buffered signal and the complementary buffered signal.

2. The input buffer circuit of claim 1, wherein the reception sensing part includes:
a reception common node;
a reception biasing part disposed between a node of a first power voltage and the reception common node, and controlling a voltage level of the reception common node toward the first power voltage;
an input receiving part comprising:
an intrinsic receiving transistor disposed between the reception common node and a node of the intrinsic intermediate signal; and
a complementary receiving transistor disposed between the reception common node and a node of the complementary intermediate signal; and
a sourcing part electrically connected to a second power voltage and sourcing current of the intrinsic intermediate signal and the complementary intermediate signal.

3. The input buffer circuit of claim 1, wherein the comparison buffering part includes:
a first comparison buffering part that compares the levels of the intrinsic intermediate signal and the complementary intermediate signal and buffers the intrinsic intermediate signal and the complementary intermediate signal to generate the intrinsic buffered signal; and
a second comparison buffering part that compares the levels of the intrinsic intermediate signal and the complementary intermediate signal and buffers the intrinsic intermediate signal and the complementary intermediate signal to generate the complementary buffered signal.

4. The input buffer circuit of claim 1, wherein the hysteresis control part is driven to control the intrinsic buffered signal and the complementary buffered signal to have forward hysteresis.

5. The input buffer circuit of claim 4, wherein the hysteresis control part includes:
a delay part that delays the intrinsic buffered signal to generate a delay signal;
an intrinsic hysteresis transistor disposed between a node of a first power voltage and the intrinsic intermediate signal, the intrinsic hysteresis transistor being turned-on in response to the first logic state of the delay signal; and
a complementary hysteresis transistor disposed between the node of the first power voltage and the complementary intermediate signal, the complementary hysteresis transistor being turned-on in response to the second logic state of the delay signal.

6. The input buffer circuit of claim 5, wherein
the first power voltage is a power supply voltage, and
each of the intrinsic hysteresis transistor and the complementary hysteresis transistor is a PMOS type transistor.

7. The input buffer circuit of claim 1, wherein the hysteresis control part controls the buffered signal pair to have forward hysteresis according to deactivation of a write signal, and controls the buffered signal pair to have backward hysteresis according to activation of the write signal.

8. The input buffer circuit of claim 7, wherein the hysteresis control part includes:
a selection delay part that delays the intrinsic buffered signal to generate a selection delay signal, the selection delay signal being a signal delayed with respect to the intrinsic buffered signal according to deactivation of the write signal, the selection delay signal being a signal delayed and inverted with respect to the intrinsic buffered signal according to activation of the write signal;
an intrinsic hysteresis transistor disposed between a node of a first power voltage and the intrinsic intermediate signal, the intrinsic hysteresis transistor being turned-on in response to the first logic state of the selection delay signal; and
a complementary hysteresis transistor disposed between the node of the first power voltage and the complementary intermediate signal, the complementary hysteresis transistor being turned-on in response to the second logic state of the selection delay signal.

9. The input buffer circuit of claim 8, wherein the selection delay part includes:
a polarity selection part that receives the intrinsic buffered signal to generate a delay preliminary signal, the delay preliminary signal being a signal in a same phase with respect to the intrinsic buffered signal according to deactivation of the write signal, the delay preliminary signal being a signal in an opposite phase with respect to the intrinsic buffered signal according to activation of the write signal; and
a delay part that delays the delay preliminary signal to generate the selection delay signal.

10. The input buffer circuit of claim 8, wherein
the first power voltage is a power supply voltage, and
each of the intrinsic hysteresis transistor and the complementary hysteresis transistor is a PMOS type transistor.

11. The input buffer circuit of claim 1, wherein
the hysteresis control part controls the buffered signal pair to have forward hysteresis according to deactivation of a write signal, and controls the buffered signal pair to have backward hysteresis according to activation of the write signal, and
the backward hysteresis of the buffered signal pair is prevented according to a blocking signal.

12. The input buffer circuit of claim 11, wherein the hysteresis control part includes:
a selection delay part that delays the intrinsic buffered signal to generate a selection delay signal, the selection delay signal being a signal delayed with respect to the intrinsic buffered signal according to deactivation of the write signal, the selection delay signal being a signal delayed and converted with respect to the intrinsic buffered signal according to activation of the write signal;
an intrinsic hysteresis transistor disposed between a node of a first power voltage and the intrinsic intermediate signal, the intrinsic hysteresis transistor being turned-on in response to the first logic state of the selection delay signal, a turn-on of the intrinsic hysteresis transistor being prevented according to activation of both of the write signal and the blocking signal; and
a complementary hysteresis transistor disposed between the node of the first power voltage and the complementary intermediate signal, the complementary hysteresis transistor being turned-on in response to the second logic state of the selection delay signal, a turn-on of the complementary hysteresis transistor being prevented according to activation of both of the write signal and the blocking signal.

13. The input buffer circuit of claim 12, wherein the selection delay part includes:

a polarity selection part that receives the intrinsic buffered signal to generate a delay preliminary signal, the delay preliminary signal being a signal in a same phase with respect to the intrinsic buffered signal according to deactivation of the write signal, the delay preliminary signal being a signal in an opposite phase with respect to the intrinsic buffered signal according to activation of the write signal; and a delay part that delays the delay preliminary signal to generate the selection delay signal.

14. The input buffer circuit of claim 12, wherein
the first power voltage is a power supply voltage, and
each of the intrinsic hysteresis transistor and the complementary hysteresis transistor is a PMOS type transistor.

15. A memory device comprising:
an input buffer circuit including:
 a reception sensing part that receives an input signal pair to generate an intermediate signal pair, a level relation between an intrinsic intermediate signal of the intermediate signal pair and a complementary intermediate signal of the intermediate signal pair being a function of a level relation between an intrinsic input signal of the input signal pair and a complementary input signal of the input signal pair;
 a comparison buffering part that buffers the intermediate signal pair to generate a buffered signal pair, an intrinsic buffered signal of the buffered signal pair being controlled to a first logic state as a level of the intrinsic intermediate signal is higher than a level of the complementary intermediate signal, a complementary buffered signal of the buffered signal pair is controlled to a second logic state as a level of the intrinsic intermediate signal is higher than a level of the complementary intermediate signal, the second logic state being opposite to the first logic state; and
 a hysteresis control part that drives the buffered signal pair to have forward hysteresis by using at least one of the intrinsic buffered signal and the complementary buffered signal.

16. The memory device of claim 15, wherein the reception sensing part includes:
 a reception common node;
 a reception biasing part disposed between a node of a first power voltage and the reception common node, and controlling a voltage level of the reception common node toward the first power voltage;
 an input receiving part comprising:
  an intrinsic receiving transistor disposed between the reception common node and a node of the intrinsic intermediate signal; and
  a complementary receiving transistor disposed between the reception common node and a node of the complementary intermediate signal; and
 a sourcing part electrically connected to a second power voltage and sourcing current of the intrinsic intermediate signal and the complementary intermediate signal.

17. The memory device of claim 15, wherein the comparison buffering part includes:
 a first comparison buffering part that compares the levels of the intrinsic intermediate signal and the complementary intermediate signal and buffers the intrinsic intermediate signal and the complementary intermediate signal to generate the intrinsic buffered signal; and
 a second comparison buffering part that compares the levels of the intrinsic intermediate signal and the complementary intermediate signal and buffers the intrinsic intermediate signal and the complementary intermediate signal to generate the complementary buffered signal.

18. The memory device of claim 17, wherein the hysteresis control part is driven to control the intrinsic buffered signal and the complementary buffered signal to have forward hysteresis.

19. The memory device of claim 18, wherein the hysteresis control part includes:
 a delay part that delays the intrinsic buffered signal to generate a delay signal;
 an intrinsic hysteresis transistor disposed between a node of a first power voltage and the intrinsic intermediate signal, the intrinsic hysteresis transistor being turned-on in response to the first logic state of the delay signal; and
 a complementary hysteresis transistor disposed between the node of the first power voltage and the complementary intermediate signal, the complementary hysteresis transistor being turned-on in response to the second logic state of the delay signal.

20. The memory device of claim 19, wherein
the first power voltage is a power supply voltage, and
each of the intrinsic hysteresis transistor and the complementary hysteresis transistor is a PMOS type transistor.

* * * * *